United States Patent
Utsumi et al.

(10) Patent No.: US 11,778,843 B2
(45) Date of Patent: Oct. 3, 2023

(54) LIGHT-EMITTING DEVICE AND MANUFACTURING METHOD OF LIGHT-EMITTING DEVICE

(71) Applicant: SHARP KABUSHIKI KAISHA, Sakai (JP)

(72) Inventors: Hisayuki Utsumi, Sakai (JP); Youhei Nakanishi, Sakai (JP); Masayuki Kanehiro, Sakai (JP); Shota Okamoto, Sakai (JP); Hiroki Imabayashi, Sakai (JP); Tatsuya Ryohwa, Sakai (JP); Kanako Nakata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 384 days.

(21) Appl. No.: 17/277,269

(22) PCT Filed: Sep. 18, 2018

(86) PCT No.: PCT/JP2018/034484
§ 371 (c)(1),
(2) Date: Mar. 17, 2021

(87) PCT Pub. No.: WO2020/059024
PCT Pub. Date: Mar. 26, 2020

(65) Prior Publication Data
US 2022/0037604 A1 Feb. 3, 2022

(51) Int. Cl.
| *H01L 51/50* | (2006.01) |
| *H10K 50/115* | (2023.01) |
| *H10K 50/15* | (2023.01) |
| *H10K 50/16* | (2023.01) |
| *H10K 50/17* | (2023.01) |
| *H10K 71/00* | (2023.01) |
| *H10K 71/13* | (2023.01) |
| *H10K 102/00* | (2023.01) |

(52) U.S. Cl.
CPC ........... *H10K 50/115* (2023.02); *H10K 50/15* (2023.02); *H10K 50/16* (2023.02); *H10K 50/171* (2023.02); *H10K 71/00* (2023.02); *H10K 71/135* (2023.02); *H10K 2102/00* (2023.02)

(58) Field of Classification Search
CPC .......................... H10K 50/115; H10K 71/00
See application file for complete search history.

(56) References Cited

U.S. PATENT DOCUMENTS

| 2013/0056705 A1 | 3/2013 | Kim et al. |
| 2020/0343489 A1 | 10/2020 | Park et al. |

FOREIGN PATENT DOCUMENTS

| CN | 102427113 A | 4/2012 |
| CN | 105322098 A | 2/2016 |
| CN | 106129263 A | 11/2016 |
| JP | 2010-055900 A | 3/2010 |
| JP | 2013-056412 A | 3/2013 |
| JP | 2015-099804 A | 5/2015 |
| KR | 10-2015-0107249 A | 9/2015 |
| KR | 10-2018-0060441 A | 6/2018 |
| WO | 2012/161179 A1 | 11/2012 |

*Primary Examiner* — Anthony Ho
(74) *Attorney, Agent, or Firm* — ScienBiziP, P.C.

(57) ABSTRACT

A light-emitting element includes an anode, a hole transport layer, a quantum dot light-emitting layer, an electron transport layer, and a cathode, in this order. The electron transport layer includes a particulate metal oxide and a conductive resin that disperses the metal oxide.

14 Claims, 4 Drawing Sheets

| SAMPLE NO. | VOLUME RATIO IN ETL (%) | | FILM THICKNESS (nm) | FILM THICKNESS CONTROLLABILITY | EXTERNAL QUANTUM EFFICIENCY EQE (%) | REMARKS |
|---|---|---|---|---|---|---|
| | ZnO NP | CONDUCTIVE RESIN | | | | |
| KNOWN EXAMPLE | 100 | - | 60.8 | GOOD | 5.2% (51 mA/cm$^2$) | REFERENCE |
| EXAMPLE 1 | 80 | 20 | 60.1 | EXCELLENT | 6.8% (34.2 mA/cm$^2$) | |
| EXAMPLE 2 | 90 | 10 | 61.4 | GOOD | 6.2% (38.8 mA/cm$^2$) | |
| EXAMPLE 3 | 95 | 5 | 60.9 | GOOD | 5.8% (44.2 mA/cm$^2$) | |
| EXAMPLE 4 | 70 | 30 | 60.3 | EXCELLENT | 6.4% (38.8 mA/cm$^2$) | |
| EXAMPLE 5 | 60 | 40 | 62.0 | GOOD | 5.4% (58.0 mA/cm$^2$) | |
| COMPARATIVE EXAMPLE 1 | 50 | 50 | 67.0 | MARGINAL | 4.7% (60.8 mA/cm$^2$) | BECAUSE BINDER RATIO IS LARGE, FILM THICKNESS IS GREATER THAN TARGET FILM THICKNESS |
| COMPARATIVE EXAMPLE 2 | 40 | 60 | 69.2 | MARGINAL | 4.4% (64.0 mA/cm$^2$) | BECAUSE BINDER RATIO IS LARGE, FILM THICKNESS IS GREATER THAN TARGET FILM THICKNESS |

FIG. 3

LIGHT-EMITTING DEVICE AND MANUFACTURING METHOD OF LIGHT-EMITTING DEVICE

TECHNICAL FIELD

The disclosure relates to a light-emitting element including a quantum dot light-emitting layer, an electron transport layer, and a cathode in this order, and a method for manufacturing the light-emitting element.

BACKGROUND ART

As illustrated in (a) of FIG. 4, a light-emitting element 100 provided with a quantum dot light-emitting diode (QLED) includes an electron transport layer (ETL) 105 between a quantum dot (QD) light-emitting layer 104 and a cathode (cathode electrode) 107. As illustrated in (b) of FIG. 4, the electron transport layer 105 is formed by spinner application of a solution in which zinc oxide (ZnO) nanoparticles (hereinafter also referred to as "ZnO NP"), which are a constituent material, are dispersed in a solvent.

However, when the electron transport layer 105 is formed by the spinner application of such a solution, the dispersibility of ZnO NP in the electron transport layer 105 is low, and accordingly, the surface flatness of the electron transport layer 105 deteriorates. As a result, electron transfer in the electron transport layer 105 becomes uneven, and it is highly likely that uniform light emission is not obtained. Further, since the electron transport layer 105 becomes non-uniform, when applying a material of the cathode (cathode electrode) 107, which is an overlying layer, thermal damage may be imparted to the quantum dot light-emitting layer 104, which is an underlying layer.

Thus, for example, in an organic electroluminescence element disclosed in PTL 1, an inorganic functional layer is provided between a transparent resin substrate and a light-emitting layer, and a metal oxide nanoparticle-containing layer, in which metal oxide nanoparticles are dispersed in an active ray-curable resin, is provided between the transparent resin substrate and the inorganic functional layer.

According to this configuration, sufficient adhesion is obtained between the metal oxide nanoparticle-containing layer and the transparent resin substrate, and between the metal oxide nanoparticle-containing layer and the inorganic functional layer.

CITATION LIST

Patent Literature

PTL 1: JP 2015-099804 A

SUMMARY

However, the metal oxide nanoparticle-containing layer of the known organic electroluminescence element disclosed in PTL 1 is a layer provided between a gas barrier layer, which serves as the inorganic functional layer, and the transparent resin substrate, and an object thereof is to secure sufficient adhesion between the metal oxide nanoparticle-containing layer and the transparent resin substrate, and between the metal oxide nanoparticle-containing layer and the inorganic functional layer, and to secure sufficient bending resistance of the organic electroluminescence element.

Therefore, there is a problem in that a combination of the metal oxide nanoparticles and a resin may not be applicable to the electron transport layer of the light-emitting element provided with the quantum dot light-emitting diode (QLED).

In other words, in the case of the electron transport layer, anything that causes the electron transport efficiency of the electron transport layer to deteriorate is not preferable. Further, in the case of the electron transport layer, the surface flatness of the electron transport layer and electron transport uniformity are required.

In light of the known problems described above, an object of the disclosure is to provide a light-emitting element capable of improving the surface flatness of an electron transport layer and improving electron transport uniformity without causing electron transport efficiency in the electron transport layer to deteriorate, and a method for manufacturing the light-emitting element.

Solution to Problem

In order to solve the problem described above, in a light-emitting element according to one aspect of the disclosure, the light-emitting element includes an anode, a hole transport layer, a quantum dot light-emitting layer, an electron transport layer, and a cathode in this order, and the electron transport layer includes a particulate metal oxide and a conductive resin that disperses the metal oxide.

In order to solve the problem described above, a method for manufacturing the light-emitting element according to one aspect of the disclosure is a method including layering an electron transport layer on a quantum dot light-emitting layer after the quantum dot light-emitting layer is cured.

Advantageous Effects of Disclosure

According to one aspect of the disclosure, an effect is achieved of providing a light-emitting element capable of improving the surface flatness of an electron transport layer and improving electron transport uniformity without causing electron transport efficiency in the electron transport layer to deteriorate, and a method for manufacturing the light-emitting element.

BRIEF DESCRIPTION OF DRAWINGS

FIG. 3 is a diagram showing Examples of the quantum dot light-emitting element.

DESCRIPTION OF EMBODIMENTS

Figure 1:
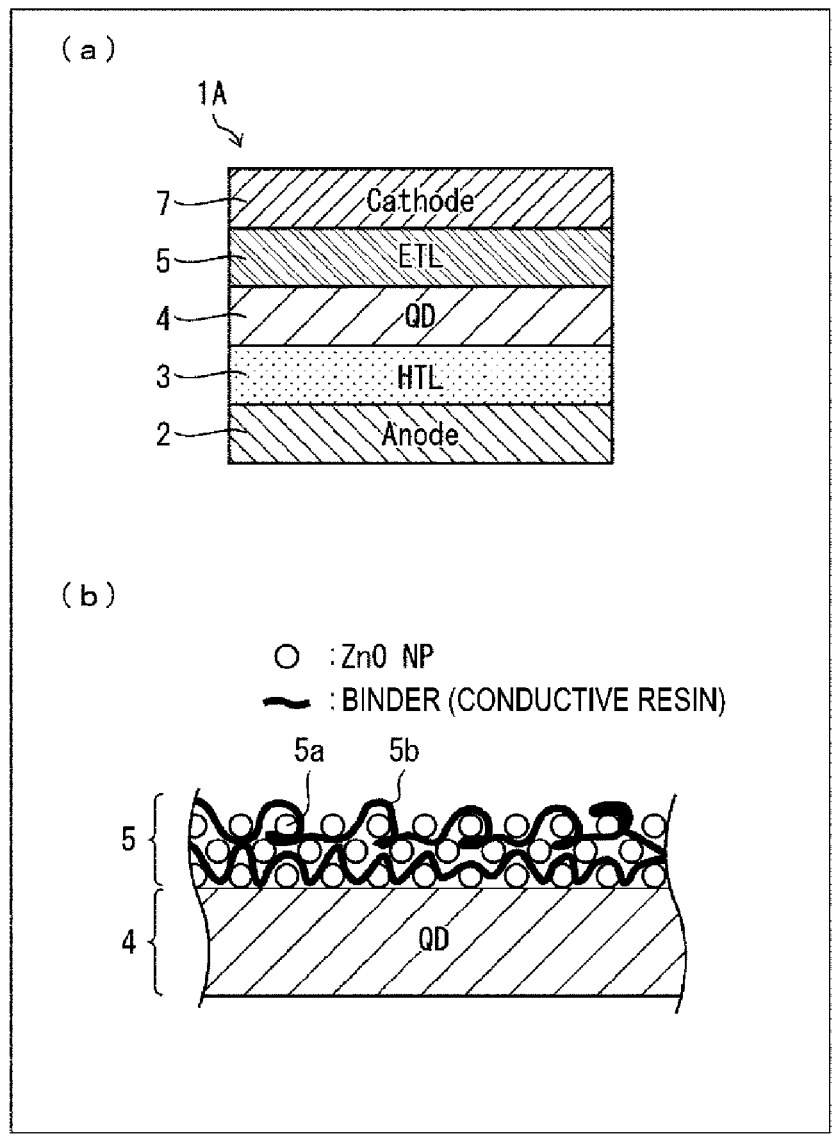
FIG. 1(a) is a cross-sectional view illustrating a configuration of a quantum dot light-emitting element according to a first embodiment of the disclosure.
FIG. 1(b) is a cross-sectional view of a detailed structure of a light-emitting layer and an electron transport layer of the quantum dot light-emitting element.
Figure 2:
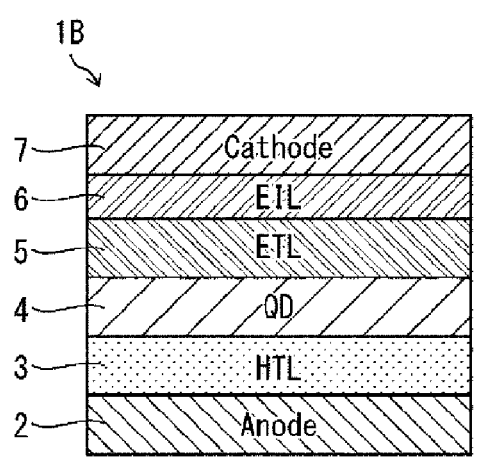
FIG. 2 is a cross-sectional view illustrating a configuration of a modified example of a quantum dot light-emitting element according to the disclosure.
Figure 4:
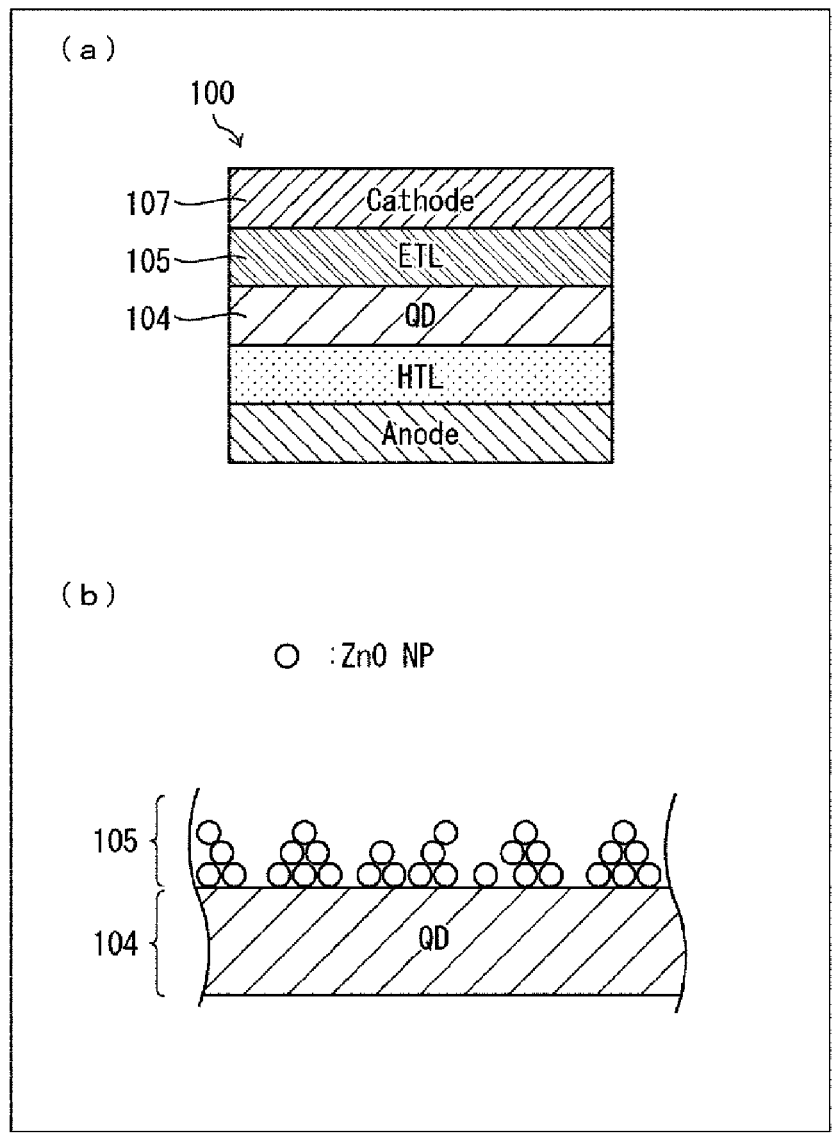
FIG. 4(a) is a cross-sectional view illustrating a configuration of a known quantum dot light-emitting element.
FIG. 4(b) is a cross-sectional view illustrating a detailed structure of a light-emitting layer and an electron transport layer of the quantum dot light-emitting element.

The following describes one embodiment of the disclosure with reference to FIGS. 1 to 3.

A light-emitting element of the present embodiment is applied to a quantum dot light-emitting element including a quantum dot light-emitting diode (QLED). Accordingly, the light-emitting element is applied to a light-emitting device provided with the quantum dot light-emitting element and an array substrate according to the present embodiment.

Configuration of Quantum Dot Light-emitting Element

First, a configuration of a quantum dot light-emitting element 1A including a quantum dot light-emitting diode (QLED) according to an embodiment of the disclosure will be described based on (a) and (b) of FIG. 1. (a) of FIG. 1 is a cross-sectional view illustrating a configuration of the quantum dot light-emitting element 1A according to the present embodiment. (b) of FIG. 1 is a cross-sectional view illustrating a detailed structure of a quantum dot light-emitting layer 4 and an electron transport layer 5 of the quantum dot light-emitting element 1A.

As illustrated in (a) of FIG. 1, the quantum dot light-emitting element 1A according to the present embodiment includes, on an anode (anode electrode) 2, a hole transport layer (HTL) 3, the quantum dot light-emitting layer 4, the electron transport layer (ETL) 5, and a cathode (cathode electrode) 76, in this order. The anode 2 of the quantum dot light-emitting element 1A that is formed in a layer overlying the array substrate (not illustrated) is electrically connected to a TFT of the array substrate.

Here, in the present embodiment, each of the anode 2, the hole transport layer 3, and the quantum dot light-emitting layer 4 is separated, for example, into red subpixels, green subpixels, and blue subpixels by insulating layers (not illustrated). However, the electron transport layer 5 and the cathode 7 are commonly formed without being separated by the insulating layers. Note that the present embodiment is not necessarily limited to this example, and the electron transport layer 5 and the cathode 7 may also be separated into each of the subpixels.

The anode 2 and the cathode 7 each include a conductive material, and are electrically connected to the hole transport layer 3 and the electron transport layer 5, respectively. One of the anode 2 and the cathode 7 is a transparent electrode. In the present embodiment, the cathode 7 is the transparent electrode, and, for example, ITO, IZO, AZO, GZO or the like is used for the transparent electrode. The cathode 7 can be formed as a film by sputtering or the like, for example. In one aspect of the disclosure, one of the anode 2 and the cathode 7 may include a metal material. In the present embodiment, the anode 2 includes a metal material. The metal material is preferably Al, Cu, Au, Ag, or the like having a high reflectivity of visible light. The quantum dot light-emitting element 1A can extract light from the side of the electrode provided as the transparent electrode. Therefore, in the present embodiment, the quantum dot light-emitting element 1A can extract light from the cathode 7 side.

The hole transport layer 3 transports positive holes from the anode 2 to the quantum dot light-emitting layer 4. The hole transport layer 3 is formed of an inorganic material, and is constituted, for example, by NiO. The hole transport layer 3 may be formed as a film by sputtering.

The electron transport layer 5 transports electrons from the cathode 7 to the quantum dot light-emitting layer 4. The electron transport layer 5 includes, for example, metal oxide particles of $ZnO$, $TiO_2$, $MgZnO$, $Ta_2O_3$, $SrTiO_3$, or the like. However, the electron transport layer 5 may include two or more of the materials. Further, in the present embodiment, as described above, the electron transport layer 5 includes the same metal oxide particles in the red subpixel, the green subpixel, and the blue subpixel. However, the present embodiment is not necessarily limited to this example, and the electron transport layer 5 may include different types of the metal oxide particles in each of the subpixels.

Further, the electron transport layer 5 is formed as a film by application of colloidal particles formed from the material of the electron transport layer. Details of the electron transport layer 5 will be described below.

The quantum dot light-emitting layer 4 emits light as a result of an occurrence of recombination between the positive holes transported from the anode 2 and the electrons transported from the cathode 7. In the present embodiment, quantum dots (QD: semiconductor nanoparticles) of each color are provided, as a luminescent material, in each of the subpixels. Specifically, the quantum dot light-emitting layer 4 includes red quantum dots in the red subpixel, green quantum dots in the green subpixel, and blue quantum dots in the blue subpixel. In other words, the quantum dot light-emitting layer 4 includes the quantum dots of a plurality of types, and includes the quantum dots of the same type in the same subpixels.

As a result, in the quantum dot light-emitting element 1A according to the present embodiment, the quantum dot light-emitting layer 4 can emit red light, green light, and blue light. Here, the red light is light having a central wavelength of the light emission in a wavelength band longer than 600 nm and shorter than or equal to 780 nm. Further, the green light is light having a central wavelength of the light emission in a wavelength band longer than 500 nm and shorter than or equal to 600 nm. Furthermore, the blue light is light having a central wavelength of the light emission in a wavelength band from 400 nm to 500 nm. Note that, in the present embodiment, the quantum dots of the plurality of types are combinations of the red quantum dots, the green quantum dots, and the blue quantum dots, but the quantum dots need not necessarily be one of those combinations.

The red quantum dot, the green quantum dot, and the blue quantum dot may include one or a plurality of semiconductor materials selected from a group including, for example, Cd, S, Te, Se, Zn, In, N, P, As, Sb, Al, Ga, Pb, Si, Ge, Mg, and compounds thereof.

The quantum dot light-emitting layer 4 can be formed as a film by separately patterning each of the subpixels using a dispersion liquid, in which the quantum dots are dispersed in a solvent such as hexane, toluene, octadecane, cyclododecene, phenylcyclohexane, or the like, by a spin coating method, an ink-jet method, or the like. The dispersion liquid may be mixed with a dispersion material such as thiol or amine.

Detailed Configuration of Electron Transport Layer

When the electron transport layer 5 of the quantum dot light-emitting element 1A having the configuration described above is formed, in the related art, a layer of zinc oxide (ZnO) nanoparticles is formed by spinner application, for example, of a solution in which a metal oxide, such as zinc oxide (ZnO), formed by nanoparticles, which is a constituent material, is dispersed in a solvent. However, when the electron transport layer 5 is formed using such a solution and a procedure, the dispersibility of the metal oxide, such as zinc oxide (ZnO) for example, formed by the nanoparticles in the electron transport layer 5 is low. As a result, the surface flatness of the electron transport layer 5 is low, and electron transfer in the electron transport layer 5 thus becomes uneven, and it is highly likely that uniform light emission is not obtained. Further, since the metal oxide formed by the nanoparticles in the electron transport layer 5 is not uniform, when the cathode 7 that is the overlying layer is applied, thermal damage may be imparted to the quantum dot light-emitting layer 4 that is the underlying layer.

This is because the particles of the metal oxide, such as zinc oxide (ZnO) for example, are small, which makes it difficult to find a solvent suitable for the particles, and as a result, the dispersibility becomes low. Further, additionally, this is because the film formation of the electron transport layer 5 is unstable due to the spinner application using the zinc oxide (ZnO) solution formed by the nanoparticles, and as a result, the surface flatness of the electron transport layer 5 is low. Furthermore, depending on an application state, intervals between the zinc oxide (ZnO) formed by the nanoparticles widen. As a result, a thermal barrier effect is low, and when forming the cathode 7, thermal damage may be imparted to the quantum dot light-emitting layer 4 that is the layer underlying the electron transport layer 5.

Thus, as illustrated in (b) of FIG. 1, in the quantum dot light-emitting element 1A of the present embodiment, the electron transport layer 5 includes metal oxide nanoparticles 5a and a conductive resin 5b, which is a binder that disperses the metal oxide nanoparticles 5a. Here, "conductive" means a property of transmitting electricity. Electricity is mainly conducted through the transfer of electrons. As a result, the nature of a substance, that is, whether the electricity easily passes through the substance (conductive), or the electricity does not easily pass through the substance (non-conductive) is determined based on whether it is easy for the electrons to move in the substance or not. As one indicator for the conductive resin 5b, there is a volume solid resistance value in particular, and this value is preferably 1.0 [Ωcm] or less. This is because if the value is 1.0 [Ωcm] or less, electrons can sufficiently flow.

As described above, the electron transport layer 5 according to the present embodiment includes the resin that disperses the metal oxide nanoparticles 5a. Thus, when forming the electron transport layer 5, first, for example, a dissolved resin is dispersed in a solvent. Next, the metal oxide nanoparticles 5a are dispersed in the solvent in which the resin is dispersed, and, if necessary, the solvent is further added in accordance with the viscosity and the solid content concentration, to obtain a solution. As a result, the dispersibility of the metal oxide nanoparticles 5a can be improved.

Then, the surface flatness of the electron transport layer 5 can be improved, for example, by the spinner application of the metal oxide nanoparticles 5a using the solution constituted by the resin and the solvent.

Furthermore, due to the high dispersibility, distances between the metal oxide nanoparticles 5a become uniform, and as a result of the resin entering into spaces between the metal oxide nanoparticles 5a, the electron transport layer 5 becomes dense, and the thermal barrier effect increases. As a result, when layering the cathode 7 on the electron transport layer 5 using a technique such as sputtering or vapor deposition, the resin mitigates the thermal damage to the quantum dot light-emitting layer 4 present in the layer underlying the electron transport layer 5. Therefore, the quantum dot light-emitting layer 4 is less susceptible to the thermal damage.

Here, in the quantum dot light-emitting element 1A according to the present embodiment, the resin is formed by the conductive resin 5b. Thus, electrical compatibility of an interface between the quantum dot light-emitting layer 4 and the electron transport layer 5 improves. Specifically, the conductive resin 5b electrically bridges the transfer of electrons from the cathode 7 to the quantum dot light-emitting layer 4 via the electron transport layer 5. In other words, in the present embodiment, since electrons are supplemented from the conductive resin 5b, an electron transport efficiency of the electron transport layer 5 does not deteriorate. Further, since the surface flatness of the electron transport layer 5 is improved, electron transport uniformity is improved.

Therefore, in the present embodiment, the quantum dot light-emitting element 1A can be provided that can improve the surface flatness of the electron transport layer 5 and the electron transport uniformity without causing the electron transport efficiency in the electron transport layer 5 to deteriorate.

Further, the conductive resin 5b of the present embodiment is light-transmissive. As a result, when light is emitted from the quantum dot light-emitting layer 4 toward the cathode 7 side, the conductive resin 5b does not block the light.

Here, in the present embodiment, the conductive resin 5b can be Poly[(9,9-bis (3'-(N, N-dimethylamino)propyl)-2, 7-fluorene)-alt-2,7-(9,9-dioctylfluorene)]. As a result, the conductive resin 5b having conductivity and light-transmitting properties can be favorably provided. Note that the conductive resin 5b is not necessarily limited to this example, and may be Poly[2-methoxy-5-(2-ethylhexyloxy)-1,4-phenylenevinylene], Poly[2-methoxy-5-(3',7'-dimethyl-octyloxy)-1,4-phenylenevinylene], Poly(3-hexylthiophene-2,5-diyl), Poly[bis(3-dodecyl-2-thienyl)-2,2'-dithiophene-5, 5'-diyl], Poly[2,5-bis (3-dodecylthiophen-2-yl)thieno[3,2-b]thiophene], Poly[2,5-bis(3-tetradecylthiophen-2-yl)thieno [3,2-b]thiophene], Poly[2,5-bis (3-hexadecylthiophen-2-yl)thieno[3,2-b]thiophene], or the like, for example.

Further, in the quantum dot light-emitting element 1A according to the present embodiment, zinc oxide (ZnO) is used as the metal oxide. Zinc oxide (ZnO) is inexpensive and readily available as a metal oxide. Further, in the present embodiment, a volume ratio (zinc oxide/conductive resin) between the zinc oxide (ZnO) and the conductive resin 5b is from 60/40 to 95/5. As a result, as illustrated in Examples to be described below, it is possible to prevent the film thickness of the electron transport layer 5 from becoming too thick without causing the electron transport efficiency in the electron transport layer 5 to deteriorate.

Further, in the quantum dot light-emitting element 1A according to the present embodiment, an electron mobility of the metal oxide nanoparticles 5a is greater than an electron mobility of the conductive resin 5b. As a result, the electron transport efficiency of the electron transport layer 5 can be controlled by the metal oxide nanoparticles 5a, which are the main substance thereof.

Further, in the quantum dot light-emitting element 1A according to the present embodiment, the solvent used for mixing the metal oxide nanoparticles 5a and the conductive resin 5b is at least one solvent selected from toluene, chlorobenzene, phenylcyclohexane, ethylene glycol monophenyl ether, isopropyl biphenyl, and 1,1-bis (3,4-dimethylphenyl) ethane. As a result, since the metal-oxide nanoparticles 5a and the conductive resin 5b can be diluted by the solvent, the metal oxide nanoparticles 5a and the conductive resin 5b can be efficiently dispersed and mixed. Further, by using the solvent in the form of a solution, coating becomes easier. Further, since these solvents are volatile, and may volatilize at a normal temperature or volatilize by hot plate heating, a solid film of the electron transport layer 5 can be easily formed.

Further, in the quantum dot light-emitting element 1A according to the present embodiment, the quantum dot light-emitting layer 4 can emit the red light, the green light, and the blue light. As a result, the so-called three primary colors can be emitted.

Further, in the quantum dot light-emitting element 1A according to the present embodiment, with respect to the quantum dot light-emitting layers 4 for each color corresponding to the red light, the green light, and the blue light, a common material is used for the electron transport layer 5. As a result, even when the quantum dot light-emitting layer 4 emits the red light, the green light, and the blue light from the respective subpixels, the common material is used for the electron transport layer 5 regardless of the type of the subpixels. Thus, the configuration of the quantum dot light-emitting element 1A can be simplified.

Further, in the quantum dot light-emitting element 1A according to the present embodiment, the electron transport layer 5 is a common layer. As a result, the configuration of the electron transport layer 5 can be simplified.

Further, in the quantum dot light-emitting element 1A according to the present embodiment, the volume solid resistance value of the conductive resin 5b is 1.0 [Ωcm] or less. As a result, electrons can sufficiently flow in the electron transport layer 5.

Further, in the quantum dot light-emitting element 1A according to the present embodiment, the electron transport layer 5 is the common layer. As a result, the configuration of the electron transport layer 5 can be simplified.

Further, in a method for manufacturing the quantum dot light-emitting element 1A according to the present embodiment, after curing the quantum dot light-emitting layer 4, the electron transport layer 5 is layered on the quantum dot light-emitting layer 4. As a result, the material of the quantum dot light-emitting layer 4 and the material of the electron transport layer 5 are not mixed with each other.

Further, in the method for manufacturing the quantum dot light-emitting element 1A according to the present embodiment, the quantum dot light-emitting layer 4 is formed at 150° C. or lower. As a result, the material of the quantum dot light-emitting layer 4 is not subjected to thermal damage.

Further, in the method for manufacturing the quantum dot light-emitting element 1A according to the present embodiment, the electron transport layer 5 is inkjet coated, and with the inkjet coating, it is possible to more accurately coat a narrow area compared to spin coating or the like. Thus, the high-quality electron transport layer 5 can be formed in terms of the film thickness and the like.

Note that the disclosure is not limited to the above-mentioned embodiment, and various changes can be made within the scope of the disclosure. For example, in the embodiment described above, an electron injection layer is not provided, but no such limitation is intended, and the electron injection layer can be provided therein.

FIG. 2 is a cross-sectional view illustrating a configuration of a quantum dot light-emitting element layer 1B provided with the electron injection layer. As illustrated in FIG. 2, an electron injection layer (EIL) 6 may be included between the cathode 7 and the electron transport layer 5. As a result, when electrons are transported from the cathode 7 to the quantum dot light-emitting layer 4 via the electron transport layer 5, the electrons are transferred from the cathode 7 to the electron transport layer 5 via the electron injection layer 6. As a result, the electrons can move more easily.

Here, also in the quantum dot light-emitting element 1B provided with the electron injection layer 6, the electron injection layer 6 can include the conductive resin 5b. In this way, by including the conductive resin 5b not only in the electron transport layer 5, but also including the conductive resin 5b in the electron injection layer 6, the quantum dot light-emitting element 1B can be provided that can improve the surface flatness of the electron injection layer 6 and the electron transport uniformity without causing the electron transport efficiency in the electron injection layer 6 to deteriorate.

Note that the same material of the conductive resin 5b included in the electron transport layer 5 can be used for the conductive resin 5b included in the electron injection layer 6, but the configuration is not necessarily limited to this example, and different materials may be used in the electron transport layer 5 and the electron injection layer 6.

EXAMPLES

A demonstration experiment was conducted on the quantum dot light-emitting element 1A according to the present embodiment in order to understand effects achieved when the electron transport layer 5 includes the metal oxide nanoparticles 5a and the conductive resin 5b. Results of the experiment will be described based on FIG. 3. FIG. 3 is a diagram showing Examples of the quantum dot light-emitting element 1A.

In the demonstration experiment, zinc oxide (ZnO) nanoparticles were used as the metal oxide nanoparticles, and Poly[(9,9-bis(3'-(N,N-dimethylamino)propyl)-2,7-fluorene)-alt-2,7-(9,9-dioctylfluorene)] was used as the conductive resin 5b. Further, chlorobenzene was used as the solvent.

Then, as shown in FIG. 3, it was confirmed how the film thickness and the external quantum efficiency changed when the volume ratio between zinc oxide (ZnO) and the conductive resin 5b (zinc oxide/conductive resin) was set to 80/20 (Example 1), 90/10 (Example 2), 95/5 (Example 3), and 70/30 (Example 4). Further, qualitative judgments were made with respect to film thickness controllability.

As a result, as shown in FIG. 3, while in the case of Known Example in which only the zinc oxide (ZnO) is used, the film thickness was 60.8 nm and the external quantum efficiency was 5.2%, in the case of Examples 1 to 4 in which the volume ratio (zinc oxide/conductive resin) was from 60/40 to 95/5, the external quantum efficiency was from 5.4% to 6.8%, which was an improvement of 5.2% compared to the external quantum efficiency of Known Example. Further, the film thickness was from 60.1 nm to 62.0 nm with no significant difference from the target film thickness, and the film thickness controllability was good.

On the other hand, when the volume ratio (zinc oxide/conductive resin) was 50/50 (Comparative Example 1), the external quantum efficiency was 4.7%, and when the volume ratio was 40/60 (Comparative Example 2), the external quantum efficiency was 4.4%. As a result, in Comparative Examples 1 and 2, the external quantum efficiency deteriorated compared to the external quantum efficiency of the Known Example of 5.2%. Further, the film thicknesses were 67.0 nm (Comparative Example 1) and 69.2 nm (Comparative Example 2), which were greater than the target film thickness, so also with respect to the film thickness, it was found that Comparative Examples 1 and 2 were not preferable. In this way, when the volume ratio of the conductive resin 5b is 50/50 or less compared to the zinc oxide, the film thickness becomes greater than the target film thickness (60 nm), and the film thickness controllability is expected to deteriorate.

As a result, it was understood that, in the quantum dot light-emitting elements 1A and 1B of the present embodiment, the volume ratio (zinc oxide/conductive resin) between the zinc oxide (ZnO) and the conductive resin 5b in the electron transport layer 5 is preferably from 60/40 to 95/5.

Supplement

In a light-emitting element according to a first aspect of the disclosure, the light-emitting element includes an anode, a hole transport layer, a quantum dot light-emitting layer, an electron transport layer, and a cathode in this order, and the electron transport layer includes a particulate metal oxide and a conductive resin that disperses the metal oxide.

In the light-emitting element according to a second aspect of the disclosure, the conductive resin may be light-transmissive.

In the light-emitting element according to a third aspect of the disclosure, the conductive resin may be Poly[(9,9-bis(3'-(N,N-dimethylamino)propyl)-2,7-fluorene)-alt-2,7-(9,9-dioctylfluorene)].

In the light-emitting element according to a fourth aspect of the disclosure, the metal oxide may be zinc oxide, and a volume ratio between the zinc oxide and the conductive resin (zinc oxide/conductive resin) may be from 60/40 to 95/5.

In the light-emitting element according to a fifth aspect of the disclosure, an electron mobility of the metal oxide may be greater than an electron mobility of the conductive resin.

In the light-emitting element according to a sixth aspect of the disclosure, a solvent used when mixing the metal oxide and the conductive resin may be at least one solvent selected from toluene, chlorobenzene, phenylcyclohexane, ethylene glycol monophenyl ether, isopropyl biphenyl, and 1,1-bis (3,4-dimethylphenyl) ethane.

The light-emitting element according to a seventh aspect of the disclosure may include an electron injection layer provided between the electron transport layer and the cathode.

In the light-emitting element according to an eighth aspect of the disclosure, the electron injection layer may include the conductive resin.

In the light-emitting element according to a ninth aspect of the disclosure, the quantum dot light-emitting layer may include quantum dot light-emitting layers for each of colors, the quantum dot light-emitting layers respectively emitting red light, green light, and blue light.

In the light-emitting element according to a tenth aspect of the disclosure, a common material may be used for the electron transport layer with respect to the quantum dot light-emitting layers for each of the colors of the red light, the green light, and the blue light.

In the light-emitting element according to an eleventh aspect of the disclosure, the electron transport layer may be a common layer.

In the light-emitting element according to a twelfth aspect of the disclosure, a volume solid resistance value of the conductive resin may be not more than 1.0 [Ω cm].

A method for manufacturing the light-emitting element according to a thirteenth aspect of the disclosure is a method including layering an electron transport layer on a quantum dot light-emitting layer after the quantum dot light-emitting layer is cured.

In the method for manufacturing the light-emitting element according to a fourteenth aspect of the disclosure, the quantum dot light-emitting layer may be formed at no higher than 150° C.

In the method for manufacturing the light-emitting element according to a fifteenth aspect of the disclosure, the electron transport layer may be inkjet coated.

Note that one aspect of the disclosure is not limited to each of the embodiments described above, and various modifications are possible within the scope indicated in the claims, and embodiments obtained by appropriately combining technical approach stated in each of the different embodiments also fall within the technical scope of one aspect of the disclosure. Furthermore, novel technical features can be formed by combining the technical approaches disclosed in the embodiments.

The invention claimed is:

1. A light-emitting element comprising:
an anode;
a hole transport layer;
a quantum dot light-emitting layer;
an electron transport layer; and
a cathode, in this order,
wherein the electron transport layer includes a particulate metal oxide and a conductive resin that disperses the metal oxide, and
the conductive resin is Poly[(9,9-bis(3'-(N,N-dimethylamino)propyl)-2,7-fluorene)-alt-2,7-(9,9-dioctylfluorene)].

2. The light-emitting element according to claim 1, wherein the conductive resin is light-transmissive.

3. The light-emitting element according to claim 1, wherein the metal oxide is zinc oxide, and a volume ratio between the zinc oxide and the conductive resin (zinc oxide/conductive resin) is from 60/40 to 95/5.

4. The light-emitting element according to claim 1, wherein an electron mobility of the metal oxide is greater than an electron mobility of the conductive resin.

5. The light-emitting element according to claim 1, wherein a solvent used when mixing the metal oxide and the conductive resin is at least one solvent selected from toluene, chlorobenzene, phenylcyclohexane, ethylene glycol monophenyl ether, isopropyl biphenyl, and 1,1-bis (3,4-dimethylphenyl) ethane.

6. The light-emitting element according to claim 1, further comprising:
an electron injection layer provided between the electron transport layer and the cathode.

7. The light-emitting element according to claim 6, wherein the electron injection layer includes the conductive resin.

8. The light-emitting element according to claim 1, wherein the quantum dot light-emitting layer includes quantum dot light-emitting layers for each of colors, the quantum dot light-emitting layers respectively emitting red light, green light, and blue light.

9. The light-emitting element according to claim 8, wherein a common material is used for the electron transport layer with respect to the quantum dot light-emitting layers for each of the colors of the red light, the green light, and the blue light.

10. The light-emitting element according to claim 9, wherein the electron transport layer is a common layer.

11. The light-emitting element according to claim 1, wherein a volume solid resistance value of the conductive resin is not more than 1.0 [Ω cm].

12. A method for manufacturing the light-emitting element according to claim 1, the method comprising:
   layering an electron transport layer on a quantum dot light-emitting layer after the quantum dot light-emitting layer is cured.

13. The method for manufacturing the light-emitting element according to claim 12,
   wherein the quantum dot light-emitting layer is formed at no higher than 150° C.

14. The method for manufacturing the light-emitting element according to claim 12,
   wherein the electron transport layer is ink-jet coated.

* * * * *